(12) United States Patent
Kashkoush (10) Patent No.: US 7,311,847 B2
(45) Date of Patent: Dec. 25, 2007

(54) SYSTEM AND METHOD FOR POINT-OF-USE FILTRATION AND PURIFICATION OF FLUIDS USED IN SUBSTRATE PROCESSING

(75) Inventor: Ismail Kashkoush, Orefield, PA (US)

(73) Assignee: Akrion Technologies, Inc.

( * ) Notice: Subject to any disclaimer, the term of this patent is extended or adjusted under 35 U.S.C. 154(b) by 353 days.

(21) Appl. No.: 10/895,511

(22) Filed: Jul. 20, 2004

(65) Prior Publication Data

US 2005/0016929 A1    Jan. 27, 2005

Related U.S. Application Data

(60) Provisional application No. 60/489,059, filed on Jul. 21, 2003.

(51) Int. Cl.
*B01D 1/00*    (2006.01)
(52) U.S. Cl. ............ 210/739; 210/96.1; 210/143; 210/263
(58) Field of Classification Search ........... 210/739, 210/96.1, 109, 143, 263; 134/25.4
See application file for complete search history.

(56) References Cited

U.S. PATENT DOCUMENTS

| | | | |
|---|---|---|---|
| 5,518,608 A * | 5/1996 | Chubachi | ............ 210/96.1 |
| 5,531,899 A | 7/1996 | Yen et al. | |
| 5,542,441 A | 8/1996 | Mohindra et al. | |
| 5,772,784 A * | 6/1998 | Mohindra et al. | ............ 134/21 |
| 6,447,684 B2 | 9/2002 | Parekh et al. | |
| 6,491,043 B2 | 12/2002 | Mohindra et al. | |
| 6,649,064 B2 | 11/2003 | Parekh et al. | |

* cited by examiner

*Primary Examiner*—Robert Hopkins
(74) *Attorney, Agent, or Firm*—Brian L. Belles; Wolf, Block, Schorr and Solis-Cohen LLP (57) ABSTRACT

A method and system for supplying an ultra-pure fluid to a substrate process chamber using point-of-use filtration and purification. The method and system provide ability to automatically monitor and control contamination levels in fluids in real time and to stop substrate processing when contamination levels exceed predetermined thresholds. In one aspect, the invention is a system comprising: a fluid supply line adapted to supply a fluid to the process chamber; filtration means operably coupled to the fluid supply line for removing positively and negatively charged particles from the fluid prior to the fluid passing into the process chamber; a purifier operably coupled to the fluid supply line in series with the filtration means for removing ionic contaminants from the fluid prior to the fluid passing into the process chamber; sensor means for repetitively measuring particle and ionic impurity levels in the fluid that has passed through the filtration means and the purifier, the sensor means producing signals indicative of the measured particle and ionic impurity levels; a controller electrically coupled to the sensor means for receiving the signals created by the sensor means, the controller adapted to respectively compare the measured particle level and the measured ionic impurity level indicated by the signals to a predetermined particle threshold and a predetermined ionic impurity threshold, wherein upon the controller determining that either the measured particle level is above the predetermined particle threshold and/or that the measured ionic impurity level is above the predetermined ionic impurity threshold, the controller further adapted to (1) activate means to alert a user, (2) cease processing of substrates in the process chamber, and/or (3) prohibit processing of substrates in the process chamber.

30 Claims, 6 Drawing Sheets

Figure 4 (Without Invention)

Figure 5

Figure 6 (Comparative)

Figure 7 (Comparative)

| Element | Fe | Al | Cu | Zn | Mn |
|---|---|---|---|---|---|
| W/O POUP | 11.35 | 9.47 | 10.44 | 8.99 | 6.75 |
| W/ POUP | 0.45 | 0.23 | 0.31 | 0.25 | 0.33 |

Figure 8

SYSTEM AND METHOD FOR POINT-OF-USE FILTRATION AND PURIFICATION OF FLUIDS USED IN SUBSTRATE PROCESSING

CROSS-REFERENCE TO RELATED APPLICATIONS

The present application claims the benefit of U.S. Provisional Patent Application, Ser. No. 60/489,059, filed Jul. 21, 2003, the contents of which are fully incorporated herein by reference.

FIELD OF THE INVENTION

The present invention relates generally the field of semiconductor integrated circuit processing, and specifically to systems and methods of supplying pure fluids to substrates, such as semiconductor wafers, for processing. However, the invention can also be applied to the manufacture of raw wafers, lead frames, medical devices, disks and heads, flat panel displays, microelectronic masks, and other applications requiring high purity fluids for processing.

BACKGROUND OF THE INVENTION

In the manufacture of semiconductors, semiconductor devices are produced on thin disk-like objects called wafers. Generally, each wafer contains a plurality of semiconductor devices. The importance of minimizing contaminants on the surface of these wafers during production has been recognized since the beginning of the industry. Moreover, as semiconductor devices become more miniaturized and complex due to end product needs, the cleanliness requirements have become more stringent. This occurs for two reasons.

First, as devices become miniaturized, a contaminating particle or impurity on a wafer will occupy a greater percentage of the device's surface area. This increases the likelihood that the device will fail. As such, in order to maintain acceptable output levels of properly functioning devices per wafer, increased cleanliness requirements must be implemented and achieved.

Second, as devices become more complex, the raw materials, time, equipment, and processing steps necessary to make these devices also become more complex and more expensive. As a result, the cost required to make each wafer increases. As such, in order to maintain acceptable levels of profitability, it is imperative to manufacturers that the number of properly functioning devices per wafer be increased. One way to increase this output is to minimize the number of devices that fail due to contamination. Thus, increased cleanliness requirements are desired.

Semiconductor wafers are typically processed in a process chamber, either as a single wafer or in batches. During production, the semiconductor wafers are subjected to a number of wet processing steps, such as cleaning, rinsing, drying, etching, etc., that expose the wafers to various process fluids, such as deionized (DI) water, acids, diluted chemistries, and gas-liquid solutions. These fluids often carry contaminants, such as particles and ionic impurities. Thus, the process fluids themselves can act to contaminate the wafers and decrease yield by carrying contaminants to the wafer surfaces.

One way in which particles and other impurities can be introduced into the process fluids is from the pipes carrying the fluids from their reservoirs/sources to the process chamber. For example, in a DI water distribution system, such as in a semiconductor foundry, DI water is typically purified from the local water supply at a central facility and then supplied to wet benches throughout the foundry by a distribution network. Even if pure water leaves the central facility, bacteria growing in the pipes can enter the rinsing system, and contaminate the wafers. In addition, the inner surface of the piping itself can introduce particles. Sources of contamination for example, can also include valves, piping elbows, and other moving parts. Thus, even if the rinse water is typically filtered by the DI water making plant, the particle counts are still high enough to negatively impact the quality of the wafer cleaning results because these liquid-borne particles will deposit onto the wafers when exposed to the DI water.

Operating a clean air and water distribution networks throughout the foundry presents an economic problem. Different parts of the manufacturing process place different demands on the cleanliness of the air and water. For example, post-HF wet processing requires extremely clean air and water, while other operations may be less susceptible to particle contamination. The cost of operating a cleaning facility is related to the degree of cleanliness and the volume of water required. Using only a centralized purification system requires that all of the air and water purified for all of the foundry that meet the requirements of the most demanding operation. Because only a relatively small amount of air and water needs to be of the highest purity, this may result in an unduly expensive central water purification system.

Additionally, even if DI water plants usually produce ultra pure DI water some contamination still takes place, for example, during the change of the resin beds. Due to the low ionic strength and high pH of DI water, these impurities can transfer from the DI water to the silicon surface of the wafer during processing. Even at 50 ppt, contamination levels in DI water can result in a measurable E10 atoms/cm$^2$.

To help eliminate contaminants that develop in the water distribution system relying on centralized purification, the entire system may be purged. For example, an $H_2O_2$ purge and DI water flush can remove bacteria growing in a DI water system. In such a centralized system, however, wafers cannot be produced while the system is being purged, causing production delays and shutdown of some operations. Consequently, such steps may be taken only when contamination problems become known to the operators. This exposes the wafers to significant levels of impurities in the water between the system purges.

Process fluid contamination problem also arise in process chambers utilizing recirculating systems. In such systems pumps and any other moving parts in the loop can be the major contributors of contamination. Moreover, because the same process fluid is being recirculated back into the process chamber after contacting (and processing) wafers, contaminants, including particles, metals, photoresist, etc., that are removed from the wafers can be reintroduced back into the process chamber and contaminate the wafers.

A number of systems have been developed in an attempt to alleviate these problems, for example, a point-of-use filtration system is disclosed in U.S. Pat. No. 6,491,043 ('043), Mohindra et al., which is hereby incorporated by reference in its entirety. The Mohindra et al. system disclosed in the '043 patent utilizes a filter bank provided on a fluid supply line prior to the process chamber. The filter bank comprises an ion exchange module and a combination of charged and neutral filters. However, the Mohindra et al. system is less than optimal for a number of reasons.

First, the filter bank of the Mohindra et al. system only removes contaminants that are about 0.1 microns (μm) or larger. With the devices on wafers becoming even more miniaturized, contaminants that are smaller than 0.1 m can negatively impact yield. Thus, the Mohindra et al. system will not meet industry needs.

Moreover, the filter bank of the Mohindra et al. system disclosed in the '043 patent does not sufficiently remove metallic ionic impurities from the fluids. In order to reduce and/or eliminate such metallic impurities from the fluid, the Mohindra et al. system utilizes an injector to inject hydrochloric acid into the fluid and/or fluid lines. The process and apparatus required to inject chemicals/acids into the fluid stream to remove metals have the disadvantage of containing moving parts, inaccurate dispense, and possible malfunctioning.

Finally, the Mohindra et al. system does not contain any means by which the contamination levels of the process fluid (e.g., DI water) can be monitored. As such, the process fluid may contain unacceptable amounts of contaminants and the user may continue to process wafers until yield issues and/or defects in the devices come to light somewhere along the production line. This can expose many wafers to unfavorable processing conditions resulting in many wafers being ruined, thereby resulting in substantial economic detriment.

Thus, a need exists for an improved system and method of providing ultra-pure fluid to a process chamber for the processing of substrates.

SUMMARY OF THE INVENTION

It is, therefore, an object of the present invention to provide a system and method to reduce or eliminate particles and/or ionic impurities in fluids used to process substrates.

Another object of the present invention is to provide a system and method of reducing or eliminating particles and/or ionic impurities in fluids used to process substrates that removes trace metals from the fluids without injecting chemicals into the fluids, such as hydrochloric acid.

Yet another object of the present invention is to provide a system and method of reducing or eliminating particles and/or ionic impurities in fluids used to process substrates that continuously monitors/measures the amount of particles and/or ionic impurities in the fluids in real time during substrate processing.

Still another object of the present invention is to provide a system and method of reducing or eliminating particles and/or ionic impurities in fluids used to process substrates that automatically alerts an operator when the amount of particles and/or ionic impurities in the fluid is above an acceptable threshold.

A further object is to provide a system and method of reducing or eliminating particles and/or molecular ionic impurities in fluids used to process substrates.

A still further object of the present invention is to provide a system and method of reducing or eliminating particles and/or ionic impurities in fluids used to process substrates that automatically ceases and/or prohibits further the processing of substrates when the amount of particles and/or ionic impurities in the fluid is above an acceptable threshold.

A yet further object of the present invention is to provide a system and method that will significantly reduce contamination in liquids and improve overall device performance of semiconductor wafers.

These and other objects are met by the present invention, which in one aspect is a system for supplying an ultra-pure fluid to a substrate process chamber comprising: a fluid supply line adapted to supply a fluid to the process chamber; filtration means operably coupled to the fluid supply line for removing positively and negatively charged particles from the fluid prior to the fluid passing into the process chamber; a purifier operably coupled to the fluid supply line in series with the filtration means for removing ionic contaminants from the fluid prior to the fluid passing into the process chamber; sensor means for repetitively measuring particle and ionic impurity levels in the fluid that has passed through the filtration means and the purifier, the sensor means producing signals indicative of the measured particle and ionic impurity levels; a controller electrically coupled to the sensor means for receiving the signals created by the sensor means, the controller adapted to respectively compare the measured particle level and the measured ionic impurity level indicated by the signals to a predetermined particle threshold and a predetermined ionic impurity threshold, wherein upon the controller determining that either the measured particle level is above the predetermined particle threshold and/or that the measured ionic impurity level is above the predetermined ionic impurity threshold, the controller further adapted to (1) activate means to alert a user, (2) cease processing of substrates in the process chamber, and/or (3) prohibit processing of substrates in the process chamber.

The system significantly reduces contamination in the fluids, and hence, contaminants that reach the substrate. The system improves the quality of the fluid and, thus, the overall performance of devices formed form the substrates. The sensor means and the controller means work in conjunction to monitor the particle and ionic impurity levels to ensure that substrates are not processed in fluids having levels of particles and/or ionic impurities that will negatively affect yield of acceptable IC devices per substrate. Preferably, the sensor means and controller operate in real time which allows an operator to be immediately notified of undesirable contamination levels in the fluid and to stop running substrates until the fluid quality is within its specified limits/thresholds.

Additionally, the controller can be further adapted to perform a check of the system's operating variables (e.g., flow rates, pump operability, megasonic source operability, etc.) upon the controller determining that either the measured particle level is above the predetermined particle threshold and/or that the measured ionic impurity level is above the predetermined ionic impurity threshold. This can be done by electrically and operably coupling the controller to the various hardware to be checked and properly programming the controller to analyze incoming signals and create and transmit appropriate output signals.

The system is preferably a point-of-use filtration and purification system. More preferably, the filtration means and the purifier are coupled to the fluid line within 12 inches of the substrate process chamber. By providing the filtration means and purifier in close proximity of the process chamber, contaminants (i.e., particles or ionic impurities) that are introduced into the fluid stream while passing through the fluid line will be removed from the fluid prior to entering the process chamber. Ideally, the distance which the fluid must flow to get to the process chamber after passing through the filtration means and the purifier is minimized as much as possible.

The filtration means can be a positively charged filter in series with a negatively charged filter, preferably having a pore rating of 0.01 μm or smaller. The positively charged filter captures negatively charged particles from the fluid while the negatively charged filter captures positively charged particles from the fluid. The purifier can be an ion exchanger. The ion exchanger removes molecular ionic impurities from the fluid, including substantially all metallic ionic impurities that may exist in the fluid. Thus, the system is free of means for injecting chemicals into the process fluid to remove metal impurities.

The sensor means preferably comprises two sensors. The first sensor counts particles in the process fluid, such as a liquid-borne particle counter. Preferably the first sensor can detect liquid born particles that are 0.03 μm and smaller. The second sensor detects ionic impurities in the fluid, such as an Inductively Coupled Plasma Mass Spectrometer (ICP-MS). Preferably, the second sensor detects ionic impurities down to parts per trillion (ppt), and most preferably has a detection limit of 5 ppt or lower for most of the heavy metals, such e.g. Fe, Cu, Al, Mn.

The sensors repetitively measure the particle and ionic impurity levels in the fluid passing by and create signals indicative of the measurements. The sensors transmit these signals to the controller for analysis (i.e., comparison to the stored predetermined particle and ionic impurity thresholds). Preferably, the measurements and transmission by the sensors to the controller are done in real time.

It is further preferable that the, sensors be coupled to the fluid line after the filtration means and the purifier but before the process chamber. This allows the sensors to measure the particle and ionic impurity levels of the fluid before it enters the process chamber and contacts the substrates. However, it is possible to locate the sensors in the process chamber, on a drain, or in a recirculation line.

The system can be incorporated into rinse tanks, dryers, any type of process tank, or process tanks which perform a plurality or processes, known as in-situ processing. The system in this embodiment is not limited by the type of process tank/chamber being used and can be used in conjunction with single-wafer process chambers or batch-type process chambers. In one embodiment, the system will comprise the process chamber, which can be a process chamber having a support for supporting at least one substrate in a substantially horizontal orientation or a process chamber having a support for supporting at least one substrate in a substantially vertical orientation. Additionally, the system can be a recirculation system and incorporate a recirculation loop/line. The system can further comprise a source of process fluid in fluid connection with the fluid line, such as a source of DI water or a source of chemicals. When the process chamber is a used to rinse substrates the fluid is preferably be DI water.

In another aspect, the invention is a method of supplying an ultra-pure fluid to a substrate process chamber comprising: providing a process chamber having a fluid supply line comprising filtration means operably coupled to the fluid supply line for removing positively and negatively charged particles from the fluid prior to the fluid passing into the process chamber and purifier operably coupled to the fluid supply line in series with the filtration means for removing ionic contaminants from the fluid prior to the fluid passing into the process chamber; flowing the fluid through the filtration means and the purifier of the fluid supply line and into the process chamber; repetitively measuring particle and ionic impurity levels in the process fluid that has passed through the filtration means and the purifier with sensor means, the sensor means electrically coupled to a controller and adapted to produce signals indicative of measured particle level and measured ionic impurity level; transmitting the signals to the controller; respectively comparing the measured particle level and the measured ionic impurity level indicated by the signals to a predetermined particle threshold and a predetermined ionic impurity threshold with the controller; and upon determining that the measured particle level and/or the measured ionic impurity level is above either of the predetermined particle threshold and/or the predetermined ionic impurity threshold, the controller (1) activating means to alert a user, (2) ceasing processing of substrates in the process chamber, and/or (3) prohibiting processing of substrates in the process chamber.

Because the purifier preferably removes substantially all molecular ionic contaminants, including trace metals, the method is preferably free of injecting chemicals into the fluid to remove metals. The measuring, transmitting, and comparing steps are preferably performed in real time so that processing of substrates with the liquid can be immediately discontinued if the particle and ionic impurity levels in the liquid is found to exceed the predetermined thresholds.

The method also preferably further includes the step of the controller performing a check of system operating variables upon determining that the measured particle level and/or the measured ionic impurity level is above either of the predetermined particle threshold and/or the predetermined ionic impurity threshold. As mentioned above, the controller can check such system variables as flow rates, pump operability, megasonic source operability, etc.

The hardware used to perform the method can incorporate any, or all, of the details discussed above. However, in order to avoid redundancy, a detailed description will be omitted with the understanding that the any of the specifics discussed above in relation to the system can be incorporated into performing the method.

MODES FOR CARRYING OUT THE INVENTION

Figure 1:
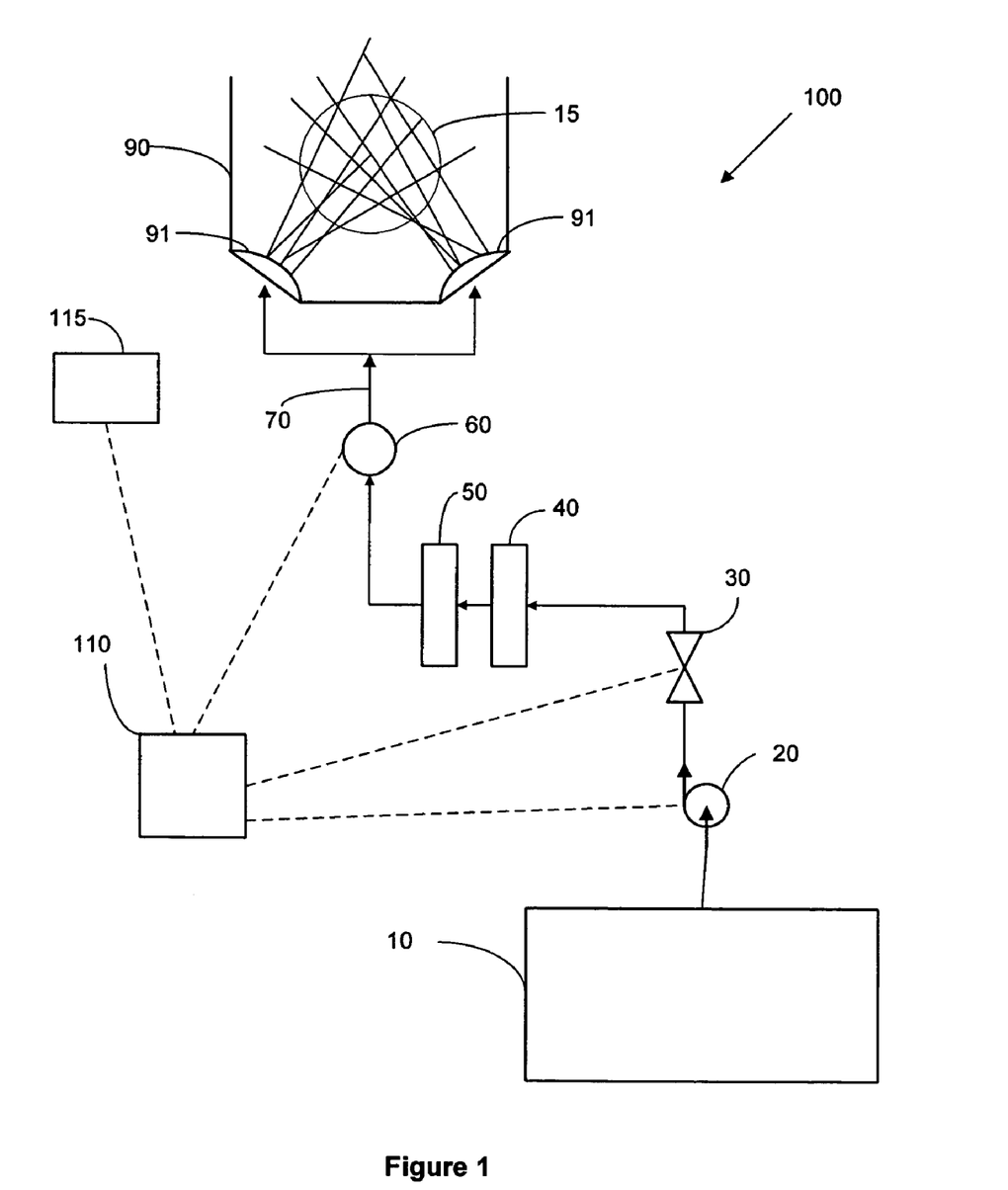
FIG. 1 is a schematic of a filtration and purification system in accordance with an embodiment of the present invention.

FIG. 1 illustrates a schematic of point-of-use filtration and purification ("POUFP") rinse system 100 in accordance with an embodiment of the present invention. While the system (and method) are described in detail with respect to a semiconductor DI water rinsing system, the invention is not so limited. The inventive system and method can be used to filter and purify any type of fluid that is used to process substrates, including but not limited to chemicals, acids, liquid-liquid mixtures, diluted chemistries, and liquid-gas solutions. The system and method is also not limited to supplying ultra-pure fluid for semiconductor wafer processing but can be used with any type of substrate processing where ultra-pure fluid is desired, such as the manufacture of raw wafers, lead frames, medical devices, disks and heads, flat panel displays, microelectronic masks, and other applications requiring high purity fluids for processing.

POUFP rinse system 100 comprises DI water reservoir 10, pump 20, adjustable valve 30, filter bank 40, purifier 50, sensor module 60, supply line 70, process chamber 90, controller 110, and alarm 115. Process chamber 90 is fluidly connected to DI water reservoir 10 via supply line 70. Pump 20 is operably coupled to the plumbing leading from DI water reservoir 10 so that upon being activated, pump 20 draws DI water from the reservoir 10 and forces it to flow through supply line 70 (and the various hardware components) and into process chamber 90. Valve 30 is also fluid and operably coupled along fluid supply line 70. Valve 30 can be adjusted between a closed position and an open position. When open, valve 30 allows DI water to pass freely flow therethrough. When closed, valve 30 prohibits DI water flow through supply line 70. The open position can be varied so that valve 70 can be sued to vary the flow rate of the DI water through supply line 70 as desired.

Filter bank 40 is operably and fluidly coupled to supply line 70 so that any DI water being supplied to process chamber 90 must pass through filter bank 40 first. Filter bank 40 removes both positively and negatively charged particles (i.e., contaminants) from the DI water passing through. Filter bank 40 incorporates at least one positively charged filter media and one negatively charged filter media in series. The filter media are constructed so as to have a positive charge and/or negative charge respectively. Thus, an electrical charge does not have to be applied to the filter media during use to capture particles. In another embodiment, filter bank 40 can contain a single filter media that can remove both negatively and positively charged particles. The filter media have a pore rating of 0.01 μm. However, filters having different pore ratings can be used depending on processing cleanliness requirements. The size of filter bank 40 (and filter media) will depend on the flow rate required by the process. Such filters are typically manufactured in 10 inch and 20 inch sizes. Examples of a suitable filter bank for use in a DI water rinse system is made by Pall Corporation, model number LDD2UNZ12E51. It should be noted that if the system is being used to filter and purify process chemicals, different part numbers may be used, depending on specific production requirements.

Purifier 50 is operably and fluidly coupled to supply line 70 so that any DI water being supplied to process chamber 90 must pass through purifier 50 first. Purifier 50 removes ionic impurities from the DI water as it passes through. Purifier 50 removes molecular sized ionic impurities, such as trace metals and other metallic impurities. In one aspect, purifier 50 can be an ion exchanger incorporating a filter having a 0.01 μm pore rating. The size of purifier 50 will depend on the flow rate required by the exact process being undertaken. Purifiers, such as ion exchangers are typically manufactured in 10 inch and 20 inch cartridge size. Examples of acceptable ion exchangers/purifiers for use in a DI water rinse system are those made by Mykrolis Corporation, model number PRC001P01 or model number RGCZ02P01. It should be noted that if the system is being used to filter and purify process chemicals, different part numbers may be used, depending on specific production requirements.

Figure 8:
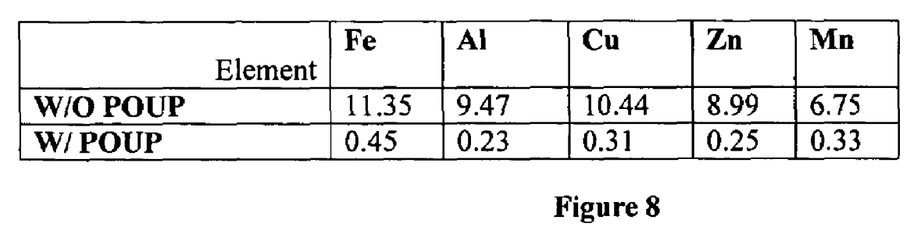
FIG. 8 is a table comparing metal removal effectiveness from DI water run through point-of-use purification in accordance with an embodiment to the same DI water prior to being run through such purification.

Thus, POUFP system 100 has trace metal removal capabilities by integrating purifier 50 as part of the overall contamination avoidance protocol. The POUFP system 100 can effectively remove trace metals, e.g. Fe, Al, Cu, Ca, Zn and Mn. In an experiment, DI water was run through the system 100 in a single pass operation, and, as represented in the data of FIG. 8, Fe was reduced from 11.35 ppb to 0.45 ppb and Cu was reduced from 10.44 to 0.31 ppb (all ppb are ppb of DI water) respectively using an ICP-MS technique. Therefore, the POUFP system 100 eliminates the need to for chemical injection methods to achieve the same purpose. As discussed above, typical procedures, such as a hydrochloric acid ("HCl") injection that ranges from 500-2000:1 (DIW: HCl) to remove metals that occasionally spike the wafer surface, can results in low minority carrier life time which adversely affect the device yield. POUFP system 100 is preferably free of chemical injection devices to remove metals form the ID water.

While filter bank 40 and purifier 50 are illustrated in POUFP system 100 as being two separate devices, it is possible to incorporate both of these devices into a single housing.

Filter bank 40 and purifier 50 are operably coupled to supply line 70 in series so that the DI water must pass through both elements before entering the process chamber 90. While filter bank 40 is illustrated upstream of purifier 50, their relative positions can be reversed. Filter bank 40 and purifier 50 are provided on supply line 70 so as to be as close to be point-of-use elements. Point-of-use is a generic term referring to providing elements (or doing things) as close as possible to the process chamber/tank (or even inside) as possible. POUFP system 100 preferably has both filter bank 40 and purifier 50 operably coupled to supply line 70 within twelve inches of where supply line 70 connects to process chamber 90. However, it is desirable that filter bank 40 and purifier 50 be as close to process chamber 90 as physically possible and can even be located inside of process chamber 90.

Sensor module 60 is provided on supply line 70 between process chamber 90 and purifier 50 and filter bank 40. However, sensor module 60 can be located anywhere downstream of the purifier 50 and filter bank 40, so long as DI water passing thereby passes through purifier 50 and filter bank 40. For example, sensor module 60 can be positioned within process chamber 90 or thereafter. In process system incorporating recirculation, the sensor module can be positioned anywhere on the recirculation loop.

Sensor module 60 is operably coupled to supply line 70 so as to be able to monitor/measure contamination levels (i.e., the particle and ionic impurity levels) in the DI water passing through supply line 70 at that point. Sensor module 60 comprises two sensors. The first sensor is a liquid-borne particle counter, such as those made by Particle Measuring Systems (PMS), models Ultra DI or HSLIS, Liquistat, CLS700, or CLS1000. The measuring technique used by the liquid-borne particle counter uses a laser scattering technique wherein a laser beam shines through the DI water, and once a particle passes by, the light is scattered and the scattering pattern determines the size of the particle. The liquid-borne particle counter will count liquid born particles in the DI water passing through supply line 70 as small as, and possibly smaller than, 0.03 µm. As discussed in detail below, these measurements are then transmitted to controller 110 as data signals for processing and analysis in real time. The particle detection sensor measures the particles as counts per size per unit volume, e.g., 100 particles per ml at 0.1 microns, 50 particles per ml at 0.2 microns, and 10 particles per ml at 0.3 microns.

The second sensor of sensor module 60 measures ionic impurity levels in the DI water passing through, using such techniques as an Inductively Coupled Plasma Mass Spectroscopy (ICP-MS) or Atomic Absorption Mass Spectroscopy (AA-MS). In typical ionic impurity detection applications, metals are placed in solution by acid digestion. The solution is sprayed into flowing argon and passed into a torch which is inductively heated to approximately 10,000° C. At this temperature, the gas and almost everything in it is atomized and ionized, forming a plasma which provides a rich source of both excited and ionized atoms. In ICP-MS techniques, positive ions in the plasma are focused down a quadrapole mass spectrometer. By acquiring the mass spectrum of the plasma, data can be obtained for almost the entire periodic table in just minutes with detection limits below 1 ug/L for most elements. Acceptable ICP-MS sensors are made by PerkinElmer Models ELAN9000, Elan DRC II, and Elan DRCe.

In AA-MS techniques, approximately 20 mL of sample is placed in a pyrolitically coated graphite tube (then called GFAA-MS) and heated very rapidly to 1500-2600° C. in order to atomize elements in the sample. Light, of a wavelength specific to a particular element and of very narrow bandwidth, is directed down the tube. The amount of light absorbed by the atomized sample is proportional to its concentration in solution. This technique provides an alternative to ICP-MS in measuring the concentration of trace metals, although ICP-MS is usually much more sensitive and has a much wider working range than AA-MS.

Process chamber 90 supports semiconductor wafer 15 in a substantially vertical position so that DI water can be applied to its surfaces via spray nozzles 91. While not illustrated, a recirculation loop can be added to process chamber 90 to recirculate the DI water (or other process chemicals) back through the supply line 70, including through filter bank 40 and purifier 50. While process chamber 90 is illustrated as supporting a wafer in a substantially vertical position and applying the DI water with spray nozzles, the invention is not so limited. For example, a variety of types of process chambers can be used, such as single-wafer process chambers that support the wafer in a substantially horizontal orientation or immersion tanks that can support a plurality of wafers in a substantially vertical orientation. The application of the fluid to the wafer can be effectuated by any means known in the art, such as cascade rinsing, spray nozzles, sparger plates, nozzles that apply thin layers of fluid on the wafer, etc. Moreover, a source of megasonic energy can be coupled to process chamber 90 to supply acoustical energy to the wafer 15 during processing.

POUFP system 100 further comprises controller 110. Controller 110 is generically illustrated but can be a suitable microprocessor based programmable logic controller, personal computer, or the like for process control. Controller 110 includes various input/output ports used to provide connections to the various components of the POUFP system 100 that need to be controlled and/or communicated with. Controller 110 also comprises sufficient memory to store process recipes and other data, such as contamination thresholds inputted by an operator. The type of controller depends on the needs of the system in which it is incorporated.

Controller 110 is electrically and operably coupled to alarm 115, sensor module 60, valve 30, and pump 20. Thus, controller 110 can receive and transmit data signals to and from these devices in real time. Controller 110 also contains a memory device having stored values for two set-points, an acceptable particle threshold and an acceptable ionic impurity threshold for the DI water. The threshold values can be inputted by a user and stored in the memory via input means such as a keyboard or other conventional means.

Figure 2:
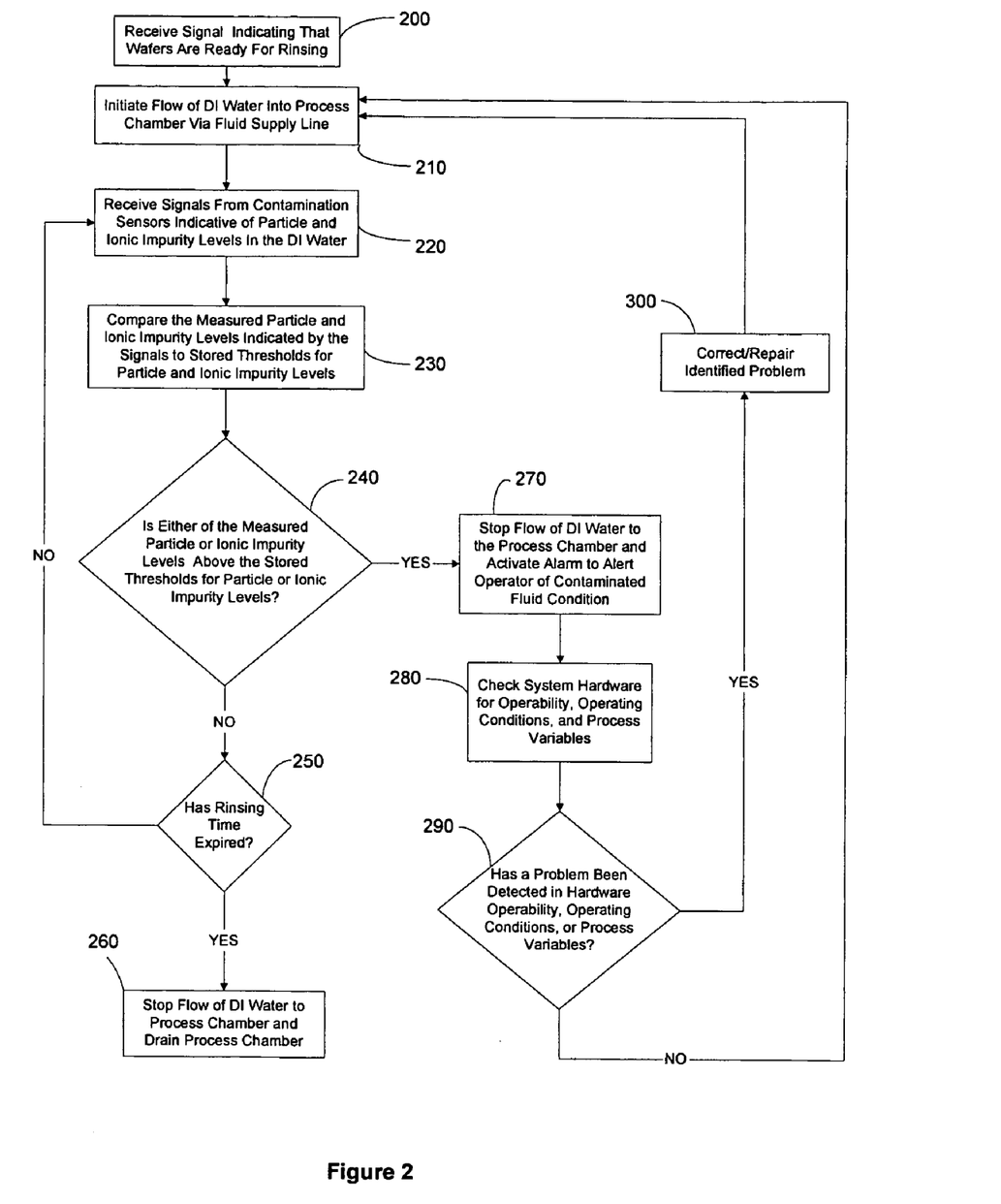
FIG. 2 is flow chart for a system controller in accordance with an embodiment f the present invention.

Referring now to FIG. 2, a flowchart for controller 110 representing operation of POUFP system 100 is illustrated. In describing FIG. 2, reference will be had to the system illustrated in FIG. 1.

In using POUFP system 100 to rinse a semiconductor wafer 15, the wafer is positioned in process chamber 90. A signal is then generated, via such means as a keyboard, that wafer 15 is ready for processing. This signal is then transmitted to, and received by controller 110, completing step 200. Alternatively, process chamber 90 can be automated so that the signal is automatically generated and transmitted upon the wafer 15 being positioned in the process chamber 90.

Upon receiving the signal that wafer 15 is ready for processing, controller 110 (through the creation and transmission of data signals) opens valve 30. By doing so, DI water is pumped from reservoir 10, through supply line 70, and into process chamber 90, thereby completing step 210. As the DI water flows from reservoir 10 to process chamber 90 via supply line 70, the DI water passes through valve 30, filter bank 40, purifier 50, and sensor module 60. As the DI water passes through filter bank 40 and purifier 50, particles and ionic impurities are removed.

After passing through the filter bank 40 and purifier 50, The DI water then passes by sensor module 60. As discussed above, sensor module 60 continuously measures levels of particles and ionic impurities in the DI water as the DI water is passing through. Measurements are taken in repetitive time intervals. Sensor module 60 (through liquid-borne counter and ionic impurity sensor) produces signals indicative of the measured particle and ionic impurity levels and transmits these signals to controller 110 via the electrical connection. Controller 110 receives these signals, completing step 220. Upon receiving the signals indicative of the measured particle and ionic impurity levels from sensor module 60, controller 110 compares the measured particle and ionic impurity levels to stored values representing predetermined particle and ionic impurity thresholds, completing step 230. In comparing the measured particle and ionic impurity levels to the predetermined particle and ionic impurity thresholds, controller 110 determines whether either of the measured particle or ionic impurity levels are above the thresholds, completing decision 240.

Figure 3:
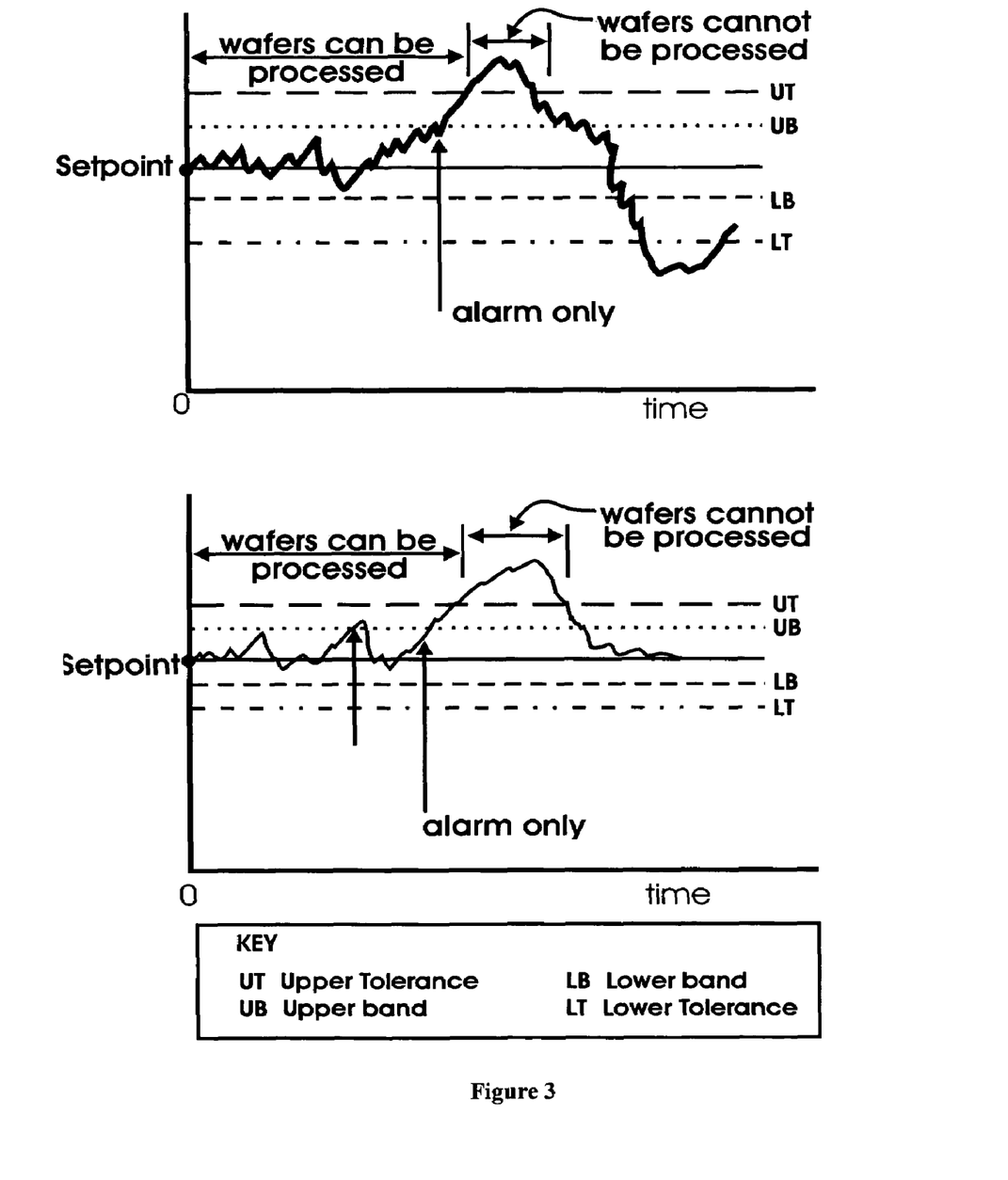
FIG. 3 is graph showing the system controller function of comparing measured contamination levels with stored predetermined contamination thresholds in accordance with an embodiment of the present invention.

If either of the measured particle or impurity levels indicated by the signals are determined to be above the respective threshold, the answer to decision block 240 is YES and controller 110 will produce and transmit an activation signal to alarm 115 and a close signal to valve 30 to keep the wafer 115 from being rinsed further. Alternatively, valve 30 does not have to be closed so long as the operator is made aware of the contaminated state of the DI water so that additional wafers are not process until the condition is fixed. A graph of controller 100 comparing measured contamination levels with stored predetermined contamination thresholds and the corresponding operating status is shown in FIG. 3.

Upon receiving their respective signals, alarm 115 will alert the operator of the contaminated condition of the DI water and valve 30 will close, thereby stopping flow of the DI water from reservoir 10, completing step 270. Alarm 11 can be an audio alarm, a visual alarm, or a combination of both, and can be displayed on a computer screen if desired. Controller 110 will then performs a check of POUFP system 100 for hardware operability, operating conditions, and process variables, completing step 280 and continues to decision block 290.

If controller 110 detects a problem with any of the hardware operability, operating conditions, or process variables, the answer at decision block 290 is YES and step 300 is undertaken. At step 300, controller 300 will automatically make the proper adjustments/repairs if possible and initiate processing of the wafer again by resuming step 210. For example, the controller 110 can take action to fix the problem following a set of rules designed by the user, such as extending the cycle time to allow the impurities to clean up. If the repair can not be undertaken automatically, controller 110 will alert the operator of the problem. However, if the answer at decision block 290 is NO, step 210 will be resumed and the operator notified of the situation.

Going back to decision block 250, if the measured particle or impurity levels indicated by the signals from sensor module 60 are both determined to be at or below their respective predetermined thresholds, the answer to decision block 240 is NO and controller 110 and controller 110 continues to decision block 250. At decision block 250, controller 110 determines whether the programmed rinsing time has expired. If the answer is NO, controller 110 proceeds back to step 220 and continues analyzing incoming signals from sensor module 60. However, if the answer is YES at decision block 250, controller 110 performs step 260 and stops the DI water flow by closing valve 30 and drains process chamber 90.

POUFP system 100 utilizes real time closed loop control. Thus, the measuring, signal creation, and signal transmission performed by sensor module 60 is preformed in real time during the processing of wafers. Also, controller 110 performs its data comparison and responses in real time during wafer processing.

Figure 4:
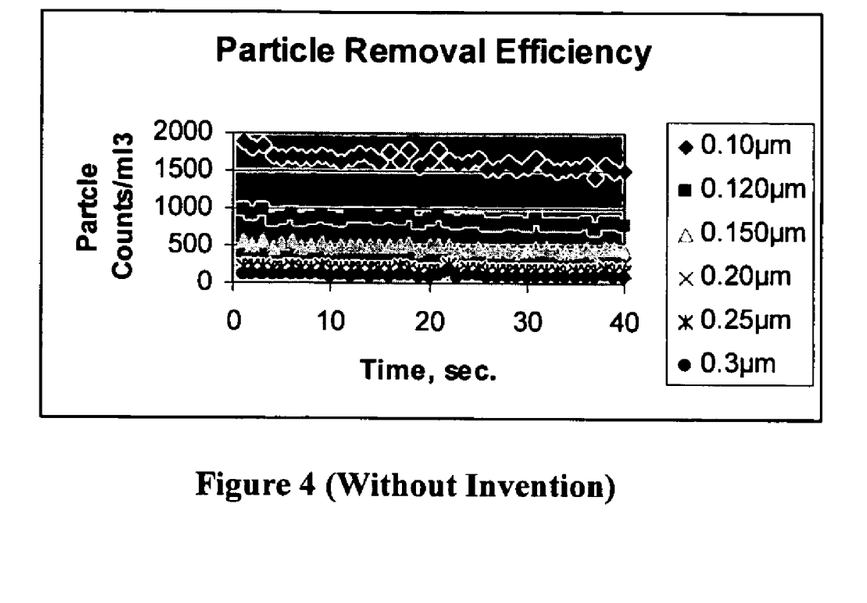
FIG. 4 is a graph showing liquid particle counts in DI water prior to the DI water being run through point-of-use filtration in accordance with an embodiment of the present invention.
Figure 5:
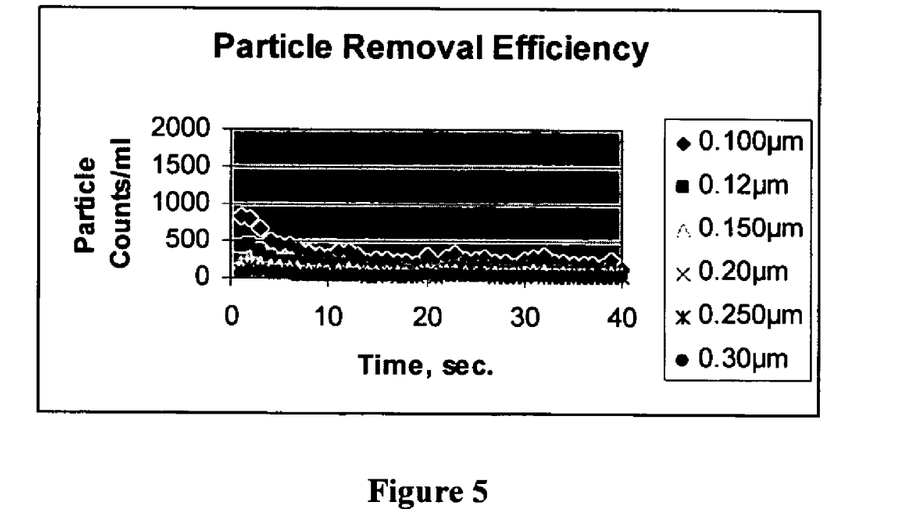
FIG. 5 is a graph showing liquid particle counts in the DI water represented in FIG. 3 after the DI water has been run through point-of-use filtration in accordance with an embodiment of the present invention.

Referring to FIG. 4, a graph showing particle counts in rinse DI water per milliliter at different particle sizes prior to the DI water being run through POUFP system 100. As shown in FIG. 5, the particle counts in the DI water are significantly reduced after being run through POUFP system 100. In addition, the recovery time with point-of-use filtration (POUF) is much less allowing for higher utilization of the system. The POUF of the present invention minimizes the fluctuation of the liquid-borne counts enhancing the predictability and control of the tool.

Figure 6:
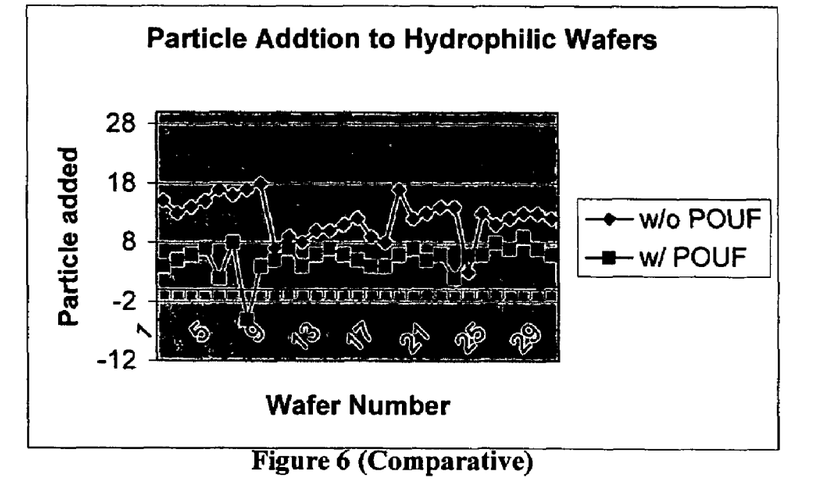
FIG. 6 is a graph comparing particle addition at 0.01 μm to hydrophillic wafers run through point-of-use filtration in accordance with an embodiment of the present invention and particle addition to hydrophillic wafers when not run through such filtration.
Figure 7:
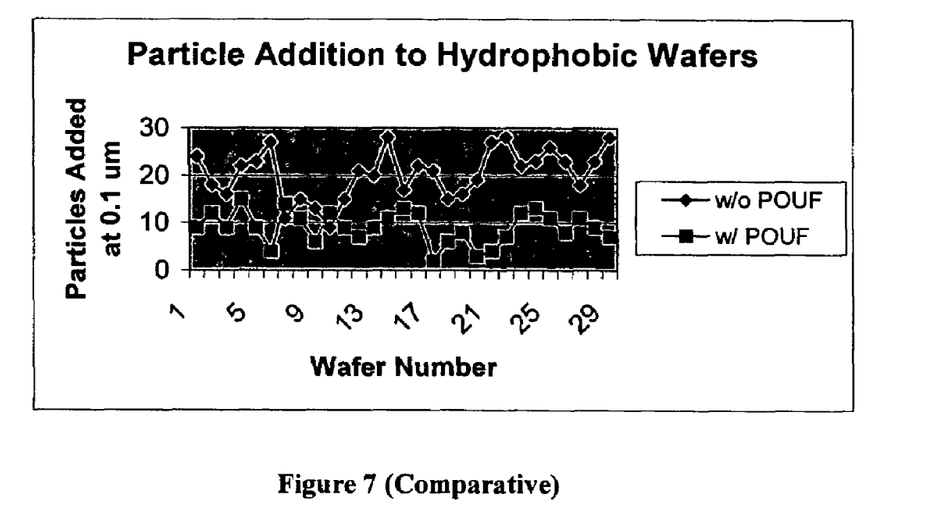
FIG. 7 is a graph comparing particle addition at 0.01 μm to hydrophobic wafers run through point-of-use filtration in accordance with an embodiment of the present invention and particle addition to hydrophobic wafers when not run through such filtration.

Referring now to FIGS. 6 and 7, benefits of using POUF according to the present invention become readily apparent with respect to particle addition. In collecting data to prepare FIGS. 6 and 7, wafers with very low initial counts (10-20 particles at 0.1 µm) were first processed in deionized rinse water that was not subject to the inventive POUF (marked as w/o POUF on FIGS. 6 and 7) and particle deposition onto wafers was monitored. Identical wafers were processed in deionized rinse water that was subjected to the inventive POUF (marked as w POUF on FIGS. 6 and 7) and particle deposition onto wafers was monitored. This was performed for both hydrophobic and hydrophilic wafers. FIG. 6 shows the particle deposition onto hydrophobic wafers. FIG. 7 shows the particle deposition onto hydrophilic wafers. As can be seen from the FIG. 6, a particle addition of 12 (standard deviation of 5) was added to wafers when POUF according to the present invention was not used while only 5 (standard deviation of 2.5) particles were added when the inventive POUF was used. These benefits was also confirmed with hydrophobic wafers (surface is more sensitive to liquid-borne contaminants). As can be seen from FIG. 7, a particle addition of 20 (standard deviation of 5) was deposited onto the wafers that were not subject to POUF in accordance with the present invention while only 9 particles were deposited (standard deviation of 3) when the inventive POUF was used. All measurements were made at 0.1 µm.

While the invention has been described and illustrated in sufficient detail that those skilled in this art can readily make and use it, various alternatives, modifications, and improvements should become readily apparent without departing from the spirit and scope of the invention. Specifically, while the purifier 50 and filter bank 40 are illustrated as and described as two separate elements, it is possible for these elements to be combined into a single housing/cartridge and perform the same functions.

What is claimed is:

1. A system for supplying an ultra-pure fluid to a substrate process chamber comprising:
   a fluid supply line adapted to supply a fluid to the process chamber;
   filtration means operably coupled to the fluid supply line for removing positively and negatively charged particles from the fluid prior to the fluid passing into the process chamber;
   a purifier operably coupled to the fluid supply line in series with the filtration means for removing ionic contaminants from the fluid prior to the fluid passing into the process chamber;
   sensor means for repetitively measuring particle and ionic impurity levels in the fluid that has passed through the filtration means and the purifier, the sensor means producing signals indicative of the measured particle and ionic impurity levels;
   a controller electrically coupled to the sensor means for receiving the signals created by the sensor means, the controller adapted to respectively compare the measured particle level and the measured ionic impurity level indicated by the signals to a predetermined particle threshold and a predetermined ionic impurity threshold, wherein upon the controller determining that either the measured particle level is above the predetermined particle threshold and/or that the measured ionic impurity level is above the predetermined ionic impurity threshold, the controller further adapted to (1) activate means to alert a user, (2) cease processing of substrates in the process chamber, and/or (3) prohibit processing of substrates in the process chamber.

2. The system of claim 1 wherein the filtration means comprises a positively charged filter in series with a negatively charged filter.

3. The system of claim 2 wherein the positively charged filter and the negatively charged filter have a pore rating of 0.01 µm or smaller.

4. The system of claim 1 wherein the filtration means and the purifier are coupled to the fluid line within 12 inches of the substrate process chamber.

5. The system of claim 1 wherein the purifier comprises an ion exchanger that removes molecular ionic impurities.

6. The system of claim 1 wherein the sensor means comprises a first sensor for counting particles in the process fluid and a second sensor for detecting ionic impurities in the fluid.

7. The system of claim 6 wherein the first sensor can detect particles having a size of 0.03 μm or smaller.

8. The system of claim 6 wherein the second sensor can detect ionic impurities within a limit of 5 parts per trillion or lower.

9. The system of claim 1 wherein the sensor means and controller operate in real time.

10. The system of claim 1 wherein the sensor means is operably coupled to the fluid supply line after the filtration means and the purifier but before the process chamber.

11. The system of claim 1 further comprising a source of fluid in fluid connection with the fluid supply line.

12. The system of claim 11 wherein the fluid is deionized water.

13. The system of claim 1 wherein the purifier removes molecular ionic impurities.

14. The system of claim 1 wherein the purifier removes substantially all trace metals.

15. The system of claim 1 free of means for injecting chemicals into the fluid to remove trace metals.

16. The system of claim 1 further comprising the process chamber having a support for supporting at least one substrate in a substantially horizontal orientation.

17. The system of claim 1 further comprising the process chamber having a support for supporting at least one substrate in a substantially vertical orientation.

18. The system of claim 1 wherein the fluid comprises deionized water.

19. The system of claim 1 wherein the controller is further adapted to perform a check of system variables upon the controller determining that either the measured particle level is above the predetermined particle threshold and/or that the measured ionic impurity level is above the predetermined ionic impurity threshold.

20. A method of supplying an ultra-pure fluid to a substrate process chamber comprising:

providing a process chamber having a fluid supply line comprising filtration means operably coupled to the fluid supply line for removing positively and negatively charged particles from the fluid prior to the fluid passing into the process chamber and a purifier operably coupled to the fluid supply line in series with the filtration means for removing ionic contaminants from the fluid prior to the fluid passing into the process chamber;

flowing the fluid through the filtration means and the purifier and into the process chamber;

repetitively measuring particle and ionic impurity levels in the process fluid that has passed through the filtration means and the purifier with sensor means, the sensor means electrically coupled to a controller and adapted to produce signals indicative of measured particle level and measured ionic impurity level;

transmitting the signals to the controller;

respectively comparing the measured particle level and the measured ionic impurity level indicated by the signals to a predetermined particle threshold and a predetermined ionic impurity threshold with the controller; and upon determining that the measured particle level and/or the measured ionic impurity level is above either of the predetermined particle threshold and/or the predetermined ionic impurity threshold, the controller (1) activating means to alert a user, (2) ceasing processing of substrates in the process chamber, and/or (3) prohibiting processing of substrates in the process chamber.

21. The method of claim 20 wherein the filtration means and the purifier are coupled to the fluid supply line within 12 inches of the substrate process chamber.

22. The method of claim 20 free of injecting chemicals into the fluid to remove metals.

23. The method of claim 20 wherein the sensor means is operably coupled to the fluid supply line after the filtration means and the purifier but before the process chamber.

24. The method of claim 20 wherein the filtration means comprises a positively charged filter in series with a negatively charged filter.

25. The method of claim 20 wherein the purifier removes substantially all trace metals from the fluid.

26. The method of claim 20 wherein the sensor means comprises a first sensor for counting particles in the fluid and a second sensor for detecting ionic impurities in the fluid.

27. The method of claim 20 wherein the measuring, transmitting, and comparing steps are performed in real time.

28. The method of claim 20 further comprising the step of the controller performing a check of system variables upon determining that the measured particle level and/or the measured ionic impurity level is above either of the predetermined particle threshold and/or the predetermined ionic impurity threshold.

29. The method of claim 20 wherein the fluid is deionized water.

30. The method of claim 20 wherein the ionic contaminants removed by the purifier are molecular ionic impurities.

* * * * *